United States Patent
Heo et al.

(10) Patent No.: US 9,165,988 B2
(45) Date of Patent: Oct. 20, 2015

(54) ORGANIC LIGHT-EMITTING DISPLAY APPARATUS HAVING DUAL INSULATING PARTS

(71) Applicant: Samsung Display Co., Ltd., Yongin, Gyeonggi-Do (KR)

(72) Inventors: Seong-Kweon Heo, Yongin (KR); Jong-Hyun Park, Yongin (KR); Chun-Gi You, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/445,441

(22) Filed: Jul. 29, 2014

(65) Prior Publication Data
US 2015/0102313 A1    Apr. 16, 2015

(30) Foreign Application Priority Data
Oct. 11, 2013  (KR) .................... 10-2013-0121497

(51) Int. Cl.
*H01L 27/32* (2006.01)
(52) U.S. Cl.
CPC ........ *H01L 27/3248* (2013.01); *H01L 27/3276* (2013.01)
(58) Field of Classification Search
CPC .................... H01L 27/3248; H01L 27/3276
See application file for complete search history.

(56) References Cited

U.S. PATENT DOCUMENTS

| | | | |
|---|---|---|---|
| 8,111,342 B2 * | 2/2012 | Kang et al. | 349/43 |
| 8,525,161 B2 * | 9/2013 | Pyo | 257/40 |
| 8,624,249 B2 * | 1/2014 | Lee et al. | 257/59 |
| 2006/0125390 A1 | 6/2006 | Oh | |
| 2012/0015158 A1 | 1/2012 | Kim et al. | |
| 2012/0104396 A1 * | 5/2012 | Pyo | 257/59 |
| 2012/0286281 A1 * | 11/2012 | You | 257/72 |
| 2013/0075737 A1 | 3/2013 | Hong | |
| 2014/0027726 A1 * | 1/2014 | Choi et al. | 257/40 |
| 2014/0042394 A1 * | 2/2014 | Lee | 257/40 |
| 2014/0124746 A1 * | 5/2014 | Hwang | 257/40 |
| 2014/0319471 A1 * | 10/2014 | Kim et al. | 257/40 |
| 2015/0108465 A1 * | 4/2015 | Koyama | 257/40 |

FOREIGN PATENT DOCUMENTS

| KR | 10-2005-0082103 A | 8/2005 |
|---|---|---|
| KR | 10-2005-0112034 A | 11/2005 |
| KR | 10-2013-0032112 A | 4/2013 |

* cited by examiner

*Primary Examiner* — Ida M Soward
(74) *Attorney, Agent, or Firm* — Knobbe Martens Olson & Bear LLP

(57) ABSTRACT

An organic light-emitting display apparatus is disclosed. The organic light-emitting display apparatus includes a substrate; a thin film transistor (TFT) formed on the substrate and including an active layer, a gate electrode, a source electrode, and a drain electrode; a first insulating layer formed on the TFT; a pixel electrode; a second insulating layer formed on the first insulating layer; and an opposite electrode formed on the intermediate layer.

20 Claims, 11 Drawing Sheets

ORGANIC LIGHT-EMITTING DISPLAY APPARATUS HAVING DUAL INSULATING PARTS

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims priority to and the benefit of Korean Patent Application No. 10-2013-0121497 filed in the Korean Intellectual Property Office on Oct. 11, 2013, the disclosure of which is incorporated herein in its entirety by reference.

BACKGROUND

1. Field

This disclosure relates to a light-emitting display apparatus.

2. Description of the Related Technology

An organic light-emitting diode (OLED) display apparatus includes a hole injection electrode, an electron injection electrode, and an organic light-emitting layer formed therebetween. The OLED display apparatus is a self-emission display apparatus in which holes and electrons injected from the hole injection electrode and the electron injection electrode, respectively, recombine in the organic light-emitting layer to emit light. The OLED display apparatus has characteristics such as low power consumption, high brightness, and a high response rate, and thus is receiving attention as a next-generation display apparatus.

SUMMARY

One or more embodiments of the present disclosure include an organic light-emitting display apparatus.

Additional aspects will be set forth in part in the description which follows and, in part, will be apparent from the description, or may be learned by practice of the presented embodiments.

Some embodiments provide an organic light-emitting display apparatus including: a substrate; a thin film transistor (TFT) formed on the substrate and comprising an active layer, a gate electrode, a source electrode, and a drain electrode; a first insulating layer formed on the TFT, and comprising a first opening formed on a place corresponding to a pixel area; a pixel electrode formed in the first opening of the first insulating layer, and electrically coupled to one of the source electrode and the drain electrode; a second insulating layer formed on the first insulating layer comprising a first insulating part comprising a second opening formed on a place corresponding to the first opening of the first insulating layer, and a second insulating part separated from the first insulating part in order to interpose a separation part between the first insulating part and the second insulating part; an intermediate layer formed on the pixel electrode and comprising an organic light-emitting layer; and an opposite electrode formed on the intermediate layer.

In some embodiments, the separation part may have a ring shape, and may be formed along an edge of the pixel area.

In some embodiments, the first insulating part may be disposed at an inside of the separation part, and the second insulating part may be disposed at an outside of the separation part.

An end portion of the pixel electrode may be disposed at an upper portion of the first opening formed in the first insulating layer.

In some embodiments, the first insulating layer may be exposed through at least a part of the separation part.

In some embodiments, at least an end portion of the pixel electrode may be disposed inside an outer end of the first insulating part.

In some embodiments, at least an end portion of the pixel electrode may extend towards the second insulating part so as to be interposed between the first insulating layer and the second insulating part of the second insulating layer.

In some embodiments, the opposite electrode may include a reflective metal layer.

In some embodiments, the organic light-emitting display apparatus may further include a transparent protection layer formed between the first insulating layer and the pixel electrode.

In some embodiments, the transparent protection layer may include a transparent conductive oxide material.

In some embodiments, the pixel electrode may further include a pixel electrode contact unit electrically coupled with the TFT through the transparent protection layer.

In some embodiments, the organic light-emitting display apparatus may further include: a third insulating layer disposed between the active layer and the gate electrode; and a fourth insulating layer disposed between the gate electrode, and the source electrode and the drain electrode.

In some embodiments, an opening formed in the fourth insulating layer, the first opening formed in the first insulating layer, and the second opening formed in the second insulating layer may overlap one another.

In some embodiments, the opening formed in the fourth insulating layer may be larger than the first opening, and the first opening may be larger than the second opening.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
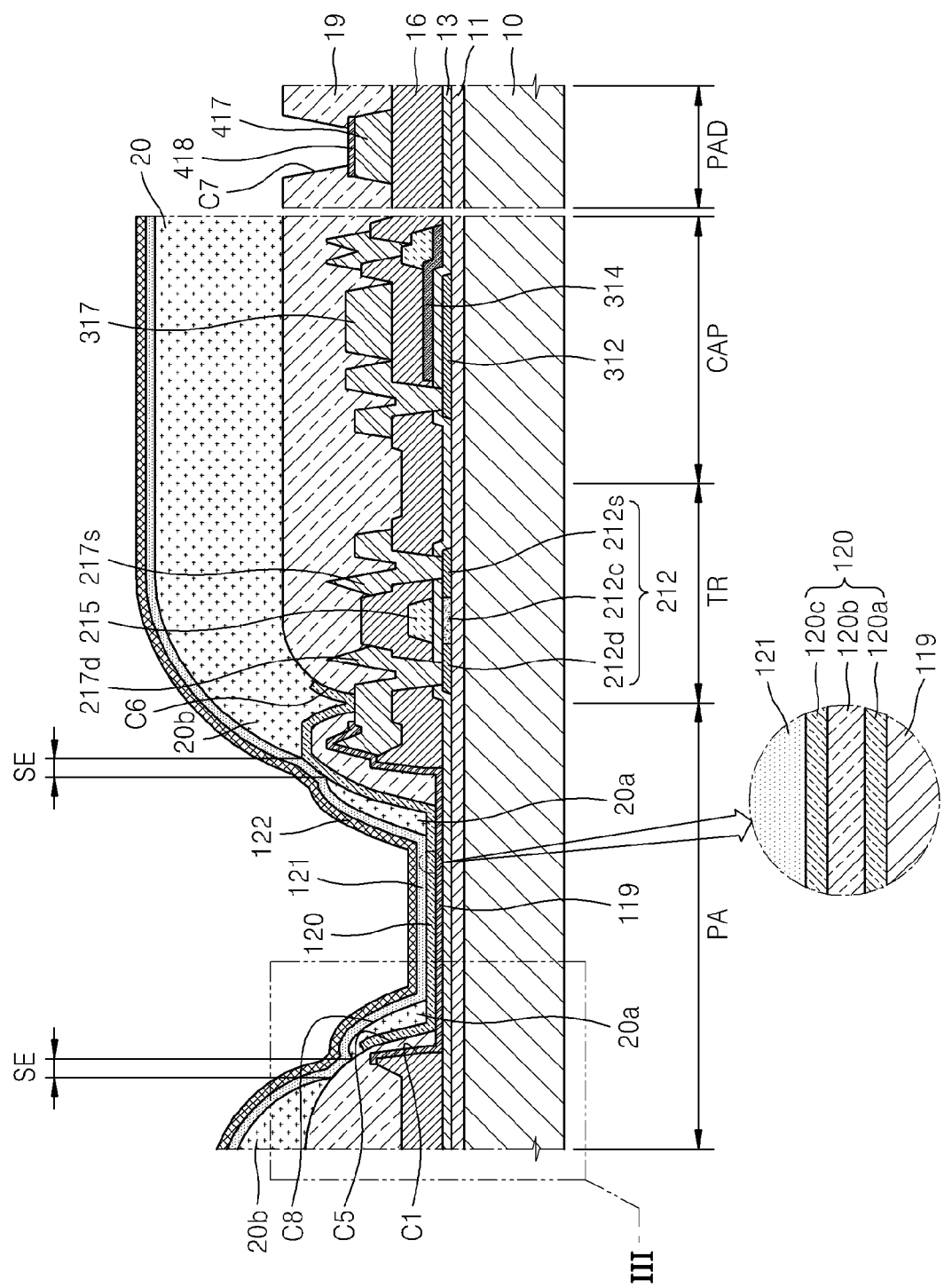
FIG. 1 is a cross-sectional view schematically illustrating an organic light-emitting display apparatus, according to an embodiment of the present invention.

The present embodiments will now be described more fully with reference to the accompanying drawings, in which exemplary embodiments are shown. The invention may, however, be embodied in many different forms and should not be construed as being limited to the embodiments set forth herein; rather, these embodiments are provided so that this disclosure will be thorough and complete, and will convey the concept of the invention to those of ordinary skill in the art.

Hereinafter, the present embodiments will be described in detail by explaining preferred embodiments with reference to the attached drawings. Like reference numerals in the drawings denote like elements, and thus their description will not be repeated.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers.

In the drawings, the sizes and the thicknesses of layers and regions are exaggerated for convenience of explanation, and thus the sizes and the thicknesses are not limited thereto.

A specific order of processes may not follow the order described herein. For example, two processes consecutively described herein may be simultaneously performed or may be performed in an order opposite to that described.

Figure 2:
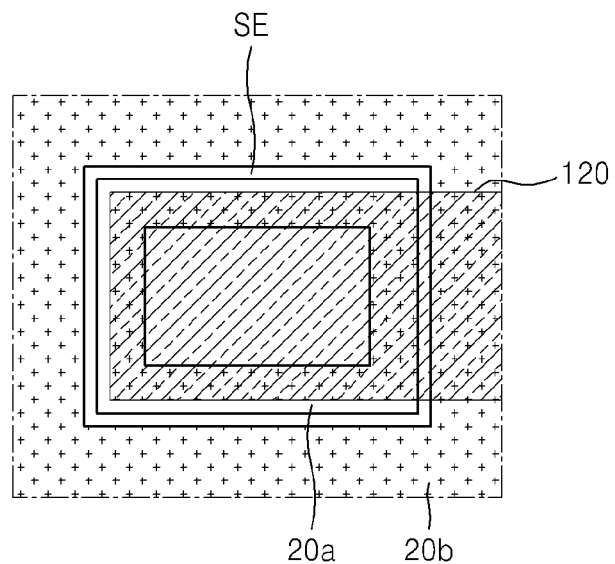
FIG. 2 is a plan view illustrating a portion of a pixel area.
Figure 3:
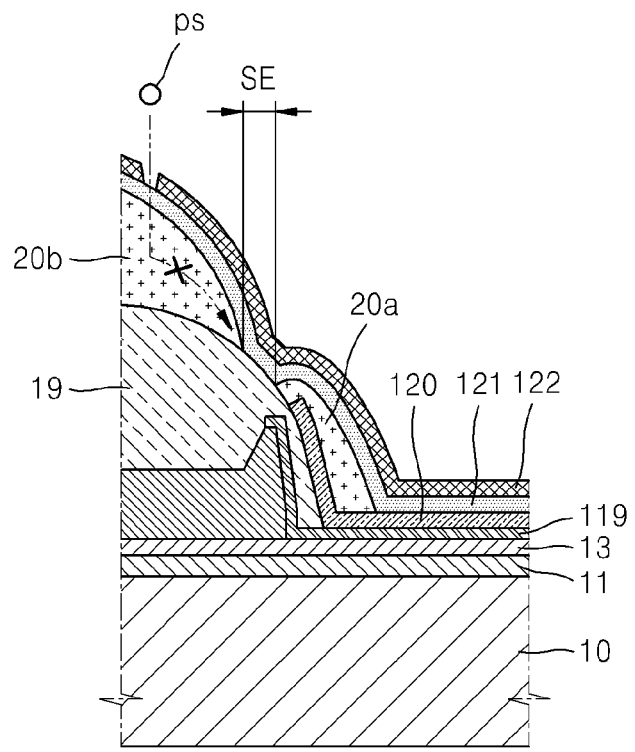
FIG. 3 is a cross-sectional view of an enlarged section III of FIG. 1.
Figure 4:
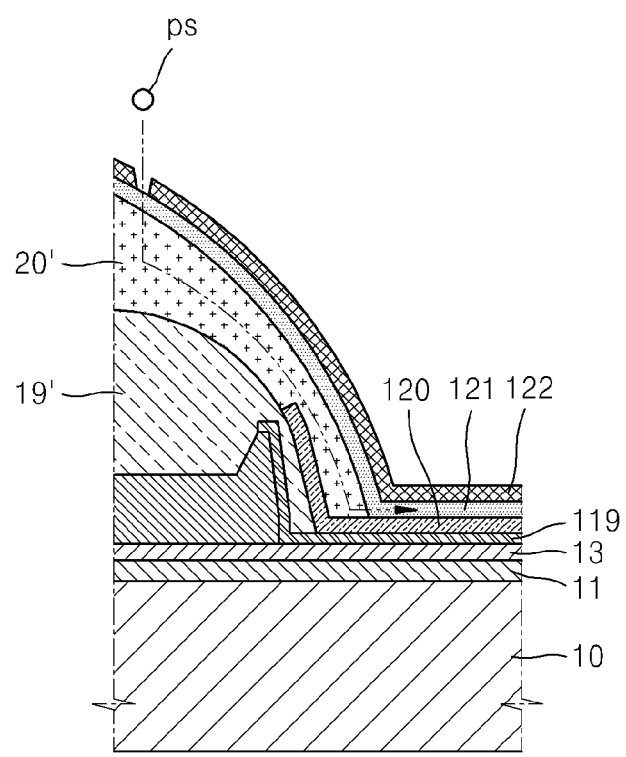
FIG. 4 is a cross-sectional view schematically illustrating a pixel area.

FIG. 1 is a cross-sectional view schematically illustrating an organic light-emitting display apparatus, according to an embodiment of the present disclosure, FIG. 2 is a plan view of a pixel area PA, and FIG. 3 is a cross-sectional view illustrating an enlarged section III of FIG. 1. FIG. 4 is a cross-sectional view schematically illustrating PA, according to a comparative example.

Referring to FIG. 1, the OLED display has a display area including a plurality of pixel areas PA formed on a substrate 10. A pad area PAD may be formed outside of the display area. In some embodiments, the pad area PAD may be electrically coupled the pixel area PA and includes a pad electrode that is a connection terminal of an external drive.

Referring to FIG. 1, the substrate 10 includes at least one pixel area PA, a transistor area TR including at least one thin film transistor (TFT), a capacitor area CAP including at least one capacitor, and a pad area PAD. In some embodiments, the pixel areas PA may include a pixel electrode 120 formed in a first opening C5 of a first insulating layer 19; an intermediate layer 121 formed on a second opening C8 of a second insulating layer 20 including a separation part SE interposed between first and second insulating parts 20a and 20b; and an opposite electrode 122 formed on the intermediate layer 121.

In some embodiments, the substrate 10 may be a glass substrate or a plastic substrate such as polyethylen terephthalate (PET), polyethylen naphthalate (PEN), or polyimide.

In some embodiments, a buffer layer 11 may be further disposed on the substrate 10 in order to form a flat surface and to prevent impurities from penetrating into the substrate 10. In some embodiments, the buffer layer 11 may be formed as a single layer or multiple layers including silicon nitride and/or silicon oxide.

In some embodiments, the TFT disposed on the transistor area TR includes an active layer 212, a gate electrode 215, a source electrode 217s, and a drain electrode 217d. An embodiment of a driving transistor for driving the organic light-emitting display apparatus is illustrated in FIG. 1. In some embodiments, the organic light-emitting display apparatus may further include a switching transistor (not shown) and/or a complementary transistor (not shown). A structure of the TFT illustrated in FIG. 1 is an example to which the organic light-emitting display apparatus is applied. However, one or more embodiments are not limited thereto.

In some embodiments, the active layer 212 may include a channel area 212c, a source area 212s where impurities are doped in an outer side of the channel area 212c, and a drain area 212d. In some embodiments, the active layer 212 may be formed to include various materials. For example, the active layer 212 may include inorganic materials such as amorphous silicon or crystalline silicon. In some embodiments, the active layer 212 may include an oxide semiconductor.

In some embodiments, a third insulating layer 13, which is a gate insulating film, may be formed on the active layer 212, and a gate electrode 215 is disposed on the third insulating layer 13 at a location corresponding to the channel area 212c. In some embodiments, the third insulating layer 13 may be formed of at least one material selected from the group consisting of silicon dioxide ($SiO_2$), silicon nitride ($Si_3N_4$), silicon oxynitride (SiON), aluminum oxide ($Al_2O_3$), titanium dioxide ($TiO_2$), tantalum pentoxide ($Ta_2O_5$), hafnium oxide ($HfO_2$), zirconium dioxide ($ZrO_2$), barium-strontium titanate (BST), and lead zirconate titanate (PZT) and may be formed as a single layer or multiple layers.

In some embodiments, the gate electrode 215 may be formed of at least one selected from the group consisting of aluminum (Al), platinum (Pt), palladium (Pd), silver (Ag), magnesium (Mg), gold (Au), nickel (Ni), neodymium (Nd), iridium (Ir), calcium (Ca), Molybdenum (Mo), titanium (Ti), tungsten (W), and copper (Cu), and may be formed as a single layer or multiple layers.

In some embodiments, a fourth insulating layer 16 that is an interlayer insulating layer is formed on the gate electrode 215, and the source electrode 217s and the drain electrode 217d are disposed on the fourth insulating layer 16. In some embodiments, the fourth insulating layer 16 may be formed of a material selected from the group consisting of $SiO_2$, $Si_3N_4$, SiON, $Al_2O_3$, $TiO_2$, $Ta_2O_5$, $HfO_2$, $ZrO_2$, BST, and PZT, and may be formed as a single layer or multiple layers.

In some embodiments, the source electrode 217s and the drain electrode 217d, respectively, connect to the source area 212s and the drain area 212d of the active layer 212 through openings formed in the fourth insulating layer 16. In some embodiments, the source and drain electrodes 217s and 217d may be formed by stacking at least two layers formed of different metals having different electron mobility. For example, the source and drain electrodes 217s and 217d may be formed of at least one selected from the group consisting of Al, Pt, Pd, Ag, Mg, Au, Ni, Nd, Ir, Cr, Li, Ca, Mo, Ti, W, and Cu, and may have at least two layers.

Although not illustrated in drawings, wiring such as data wiring and electrode power supply wiring that has the same materials as in the source and drain electrodes 217s and 217d may be disposed on the same layer as the source and drain electrodes 217s and 217d.

In some embodiments, the source and drain electrodes 217s and 217d are covered by the first insulating layer 19 that functions as a planarization insulating layer. In some embodiments, the first insulating layer 19 may include organic materials.

If electrons are supplied to metal having a strong reduction like silver (Ag) forming the pixel electrode 120 during an etching process for patterning the pixel electrode 120, silver (Ag) ions present in an etchant in an ion state may be problematically educed as silver (Ag) again. Such educed silver (Ag) may be a particle related defect factor causing a dark spot during a subsequent process of forming the pixel electrode 120.

When the source and drain electrodes 217s and 217d, data wiring (not shown), and electrode power wiring (not shown) that are made of the same material as in the source and drain electrodes 217s and 217d are exposed to an etchant during etching of the pixel electrode 120 including the silver (Ag), silver (Ag) ions having a strong reduction may be educed as silver (Ag) again by receiving electrons from metal materials. For example, if the above-described metal materials include Mo or Al, silver (Ag) may be educed again by providing electrons received from molybdenum or aluminum to silver (Ag) ions again. The educed silver (Ag) particles may reattach to the pixel electrode 120 in a following process, thus resulting in defects such as dark spots.

However, in some embodiments of the organic light emitting display apparatus, the data wiring (not shown) and/or the electrode power supply wiring (not shown) that are formed of the same material and disposed on the same layer as the source and drain electrodes 217s and 217d are protected by being covered with the first insulating layer 19 that is an organic planarization insulating layer during the pattering/etching of the pixel electrode 120. Accordingly, the silver (Ag) particles educed while etching the pixel electrode 120 may not be attached to the pixel electrode 120, thus preventing problems regarding dark spots.

In the pixel areas PA, an organic light-emitting diode (OLED) including the pixel electrode 120, the intermediate layer 121, and the opposite electrode 122 is formed.

In some embodiments, the pixel electrode 120 is electrically coupled to one of the source electrode 217s and the drain electrode 217d of the TFT. Furthermore, the pixel electrode 120 may include the transflective metal layer 120b, and first and second transparent conductive oxide layers 120a and 120c which are respectively formed at a top surface of and/or a bottom surface of the transflective metal layer 120b.

In some embodiments, the transflective metal layer 120b may be formed of silver (Ag) or silver (Ag) alloy. Since the transflective metal layer 120b forms a micro-cavity structure with the opposite electrode 122 that is a reflective electrode, luminescence efficiency of the OLED display may be improved.

In some embodiments, the first and second transparent conductive oxide layers 120a and 120c may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

In some embodiments, the first transparent conductive oxide layer 120a disposed at the bottom of the transflective metal layer 120b may reinforce adhesion of the pixel electrode 120 and a transparent protection layer 119 that will be further described later. In some embodiments, the second transparent conductive oxide layer 120c disposed on the top of the transflective metal layer 120b may function as a barrier layer protecting the transflective metal layer 120b.

In some embodiments, the transparent protection layer 119 may be disposed at the bottom of the pixel electrode 120. For example, the transparent protection layer 119 may be disposed in an opening C1 formed in the fourth insulating layer 16. In some embodiments, the transparent protection layer 119 may include at least one material selected from the group consisting of ITO, IZO, ZnO, $In_2O_3$, IGO, and AZO.

In some embodiments, the transparent protection layer 119 may be interposed between the pixel electrode 120 and the third insulating layer 13, may planarize an upper surface of the third insulating layer 13 formed of inorganic material, and may prevent dark spots.

When there is no transparent protection layer 119 between the pixel electrode 120 and the third insulating layer 13, silver (Ag) included in the transflective metal layer 120b reacts with a silicon oxide film and is dispersed. As a result, the transflective metal layer 120b generates a void, and the dispersed silver (Ag) generates dark spots.

However, the transparent protection layer 119 is disposed between the pixel electrode 120 and the third insulating layer 13, and thus, even though a material that may easily react with the silver (Ag) is formed on the third insulating layer 13, the transparent protection layer 119 may block the reaction of silver (Ag) and the material. Therefore, the dark spots may be improved or prevented by restricting reactivity of the silver (Ag) particles.

In some embodiments, the pixel electrode 120 is disposed in the first opening C5 formed in the first insulating layer 19. In some embodiments, the first insulating layer 19 may be formed of organic materials. For example, the first insulating layer 19 may include general-purpose polymers such as PMMA or PS, polymer derivatives having a phenol group, an acryl-based polymer, an imide-based polymer, an aryl ether-based polymer, an amide-based polymer, a fluorine-based polymer, a p-xylene based polymer, a vinyl alcohol-based polymer, and compounds thereof.

In some embodiments, the first opening C5 formed in the first insulating layer 19 may overlap with the opening C1 formed in the fourth insulting layer 16 and the second opening C8 formed in the second insulating layer 20. For example, the first opening C5 may be smaller than the opening C1 formed on the fourth insulating layer 16 and larger than the second opening C8.

In some embodiments, the second insulating layer 20 is disposed on the first insulating layer 19 as a pixel definition layer. In some embodiments, the second insulating layer 20 may be formed of organic materials. For example, the second insulating layer 20 may general-purpose polymers such as PMMA or PS, polymer derivatives having a phenol group, an acryl-based polymer, an imide-based polymer, an aryl ether-based polymer, an amide-based polymer, a fluorine-based polymer, a p-xylene based polymer, a vinyl alcohol-based polymer, and compounds thereof.

Referring to FIGS. 1 and 2, the second insulating layer 20 includes the second opening C8, and is discontinuously formed. For example, the second insulating layer 20 may include a separation part SE exposing a portion of the first insulating layer 19, and first and second insulating parts 20a and 20b separated from each other by interposing the separation part SE therebetween. In some embodiments, a line width of the separation part SE may be wider than about 5 μm, and that of the first insulating layer 20a disposed inside the separation part SE may be wider than about 7 μm.

In some embodiments, the separation part SE interposed between the first and second insulating parts 20a and 20b may be formed as a ring type along an edge of the pixel areas PA, and the first insulating part 20a may be disposed inside the separation part SE, and the second insulating layer 20b may be disposed outside the separation part SE. Since the second opening C8 is formed in an inner portion of the first insulating layer 20a, the first insulating layer 20a may be formed to have a ring shape along the edge of the pixel areas PA.

In some embodiments, an end portion of the pixel electrode 120 may extend up to an upper portion of the first opening C5 formed in the first insulating layer 19. For example, the pixel electrode 120 may be extended to cover not only a top surface of the transparent protection layer 119 exposed through the first opening C5 but also at least a portion of the first insulating layer 19. In some embodiments, at least an end portion of the pixel electrode 120 is extended to be disposed inside of an outer end of the first insulating part 20*a* and is covered with the first insulating part 20*a*, and another end portion of the pixel electrode 120 may be extended to pass the separation part SE in order to be electrically coupled to the drain electrode 217*d* of the TFT.

In some embodiments, the second insulating layer 20 includes the separation part PE, thereby preventing pollution of the intermediate layer 121 caused by an external source of pollution ps. In contrast, as illustrated in FIG. 4, in a case where the second insulating layer 20' formed on the first insulating layer 19' has no separation part SE, the external source of pollution ps, which penetrates inside through a fine crack or a hole formed during a manufacturing procedure or formed in the opposite electrode 122, may move to the intermediate layer 121 including a light-emitting layer via a bulk of the second insulating layer 20'. The external source of pollution ps transferred via the bulk of the second insulating layer 20' may become a cause of pixel shrinkage that deteriorates the organic light-emitting layer.

However, as illustrated in FIG. 3, since the second insulating layer 20 includes the separation part SE disposed between the first insulating part 20*a* and the second insulating part 20*b*, it is possible to block a transfer path of the external source of pollution ps and to restrict the pixel shrinkage phenomenon.

In some embodiments, the intermediate layer 121 may include the organic light-emitting layer, and may be formed on the pixel electrode 120 whose top surface is exposed through the second opening C8. In some embodiments, the organic light-emitting layer may include low-molecular weight organic materials, high-molecular weight organic materials, or hybrid compounds in which the low-molecular weight and high-molecular weight organic materials are mixed. In some embodiments, the intermediate layer 121 may further include at least one of a hole injection layer (HIL), a hole transport layer (HTL), an electron transport layer (ETL), and an electron injection layer (EIL). However, one or more embodiments are not limited thereto, and the intermediate layer 121 may further include various functional layers.

An organic light-emitting display apparatus as shown in FIG. 1 shows an example of one subpixel forming a unit pixel, and the subpixel may emit diverse colors of light. For example, the subpixel may emit red, green, or blue light.

Alternatively, the subpixel may emit white light. When the subpixel emits the white light, the organic light-emitting display apparatus may further include a color converting layer or a color filter for converting the white light into another color of light. The subpixel emitting the white light may have diverse structures, for example, a structure that luminescent materials emitting red, green, and blue light, respectively, are stacked.

As another example of a subpixel emitting the white light, a mixture of materials emitting red, green, and blue light may be used as well.

However, one or more embodiments are not limited thereto. That is, emission of the white light may mean that combinations of various colors other than a combination of red, green, and blue light may be used.

In some embodiments, an opposite electrode 122 is disposed on the emissive layer 121 so as to serve as a common electrode. In some embodiments, the opposite electrode 122 may include a reflective metal layer. For example, a metal layer formed of at least one of Al, Mg, Ca, and nickel fluoride (LiF) may be formed as a single layer or multiple layers.

As described above, the pixel electrode 120 may be connected to an electrode of the TFT and operate. For example, the pixel electrode 120 may be connected to the drain electrode 217*d* through a contact hole C6 formed in the first insulating layer 19.

Also, the pixel electrode 120 may be electrically connected to the TFT through a pixel electrode contact unit. For example, the transparent protection layer 119 disposed at the bottom of the pixel electrode 120 may be the pixel electrode contact unit, and the pixel electrode 120 may be connected to the TFT through the transparent protection layer 119.

When the pixel electrode 120 and a driving TFT are only connected with each other through the contact hole C6 formed in the first insulating layer 19 as a method of electrically coupling the pixel electrode 120 and the driving TFT, a thickness of the pixel electrode 120 that is the transflective metal layer 120*b* is thin and a step coverage is defective so that the pixel electrode 120 may not be stably coupled to an etched surface of the third insulating layer 13 or the contact hole C6. However, according to the present embodiments, although a connection through the contact hole C6 formed on the first insulating layer 19 fails, the pixel electrode 120 may be connected to the TFT through the transparent protection layer 119 so that a driving signal may be stably provided.

In a capacitor area CAP, a capacitor including a first electrode 312 disposed on the same layer as the active layer 212, a second electrode 314 disposed on the same layer as the gate electrode 215, and a third electrode 317 disposed on the same layer as the source and drain electrodes 217*s* and 217*d* may be disposed.

In some embodiments, the first electrode 312 of the capacitor may be formed as a semiconductor in which ion impurities are doped as in source and drain areas 212*s* and 212*d*.

In some embodiments, the second electrode 314 of the capacitor is disposed on the third insulating layer 13 like the gate electrode 215, but materials are different. Materials of the second electrode 314 may include a transparent conductive oxide. Through the second electrode 314, a semiconductor doped with the ion impurities may be formed on the first electrode 312, and thus the capacitor may be formed as a metal-insulator-metal (MIM) structure.

In some embodiments, the third electrode 317 of the capacitor may be formed of the same material as in the source and drain electrodes 217*a* and 217*b*. In some embodiments, the third electrode 317 is covered by the first insulating layer 19 that is the organic planarization layer so that the third electrode 317 is not exposed to the etchant including the silver while etching the pixel electrode 120 including the silver. Therefore, a defect cased by reduction of the silver may be prevented.

In some embodiments, the third electrode 317 of the capacitor is connected in parallel together with the first and second electrodes 312 and 314, and thus capacitance of the organic light-emitting display apparatus may be increased without an increase in an area of the capacitor. Therefore, the area of the capacitor may be decreased and an aperture ratio may be increased as much as the increased capacitance.

In some embodiments, a pad area PAD is disposed outside a display area, and includes a pad electrode that is a connection terminal of an external driver. The pad electrode includes first and second pad layers 417 and 418.

In some embodiments, the first pad layer 417 may include a plurality of metal layers having different electron mobility.

For example, the first pad layer 417 may be formed of at least one selected from the group consisting of Al, Pt, Pd, Ag, Mg, Au, Ni, Nd, Ir, chromium (Cr), lithium (Li), Ca, Mo, Ti, W, and Cu, and may be formed as multiple layers.

In some embodiments, the second pad layer 418 may include the same materials as in the transparent protection layer 119. For example, the second pad layer 418 may be formed of a transparent conductive oxide including at least one selected from the group consisting of ITO, IZO, ZnO, $In_2O_3$, IGO, and AZO. In some embodiments, the second pad layer 418 may prevent exposure of the first pad layer 417 to moisture and oxygen, thus preventing a decrease of reliability of the pad electrode. Since the second pad layer 418 and the transparent protection layer 119 include identical materials, they may be formed through an identical procedure and may be formed without a separate mask.

Although not illustrated in FIG. 1, the organic light-emitting display apparatus may further include an encapsulation member (not shown) of encapsulating a display area including the pixel areas PA, the capacitor area CAP, and a transistor area TR. In some embodiments, the encapsulation member may include a substrate including a glass material, a metal film, or an encapsulating thin film in which an organic insulating layer and an inorganic insulating layer are alternatively stacked.

Hereinafter, a method of manufacturing the organic light-emitting display apparatus will be described with reference to FIGS. 5A through 5I.

FIGS. 5A through 5L are cross-sectional views schematically illustrating a method of manufacturing the organic light-emitting display apparatus, according to embodiments of the present disclosure.

Figure 5A:
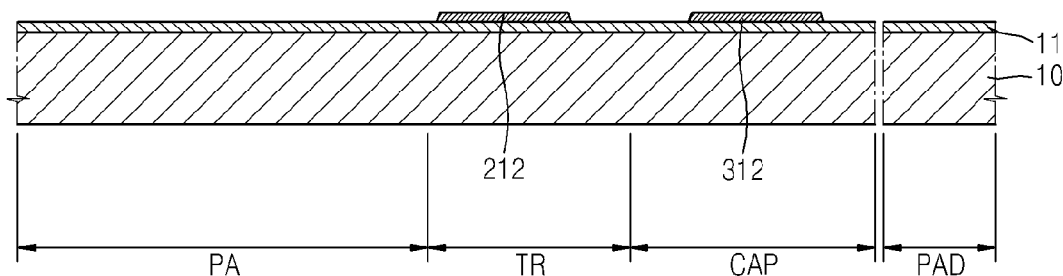
FIGS. 5A through 5L are cross-sectional views illustrating a method of manufacturing the organic light-emitting display apparatus.

FIG. 5A is a cross-sectional view schematically illustrating a first mask process of the organic light-emitting display apparatus.

Referring to FIG. 5A, buffer layer 11 is formed on the substrate 10, and a semiconductor layer (not shown) is formed on the buffer layer 11 and patterned to form an active layer 212 of a TFT and a first electrode 312 of a capacitor.

Although not illustrated in FIG. 5A, the active layer 212 and the first electrode 312 may be formed after spreading photo resist (not shown) on the semiconductor layer, and patterning the semiconductor layer through a photolithography process using a first photo mask (not shown). In some embodiments, the first mask process, which is performed through the photolithography process, is conducted by exposing light onto the first photo mask with a lithography apparatus (not shown), and then, by sequentially performing a developing process, an etching process, and a stripping process or an ashing process.

In some embodiments, the semiconductor layer (not shown) may include amorphous silicon or polysilicon. In this case, the polysilicon may be formed by crystallizing the amorphous silicon. In some embodiments, the amorphous silicon may be crystallized through various methods such as a rapid thermal annealing (RTA) method, a solid phase crystallization (SPC) method, an excimer laser annealing (ELA) method, a metal induced crystallization (MIC) method, a metal induced lateral annealing (MILC) method, a sequential lateral solidification (SLS) method. However, one or more embodiments are not limited thereto, and the semiconductor layer may include an oxide semiconductor, and an organic semiconductor.

Figure 5B:
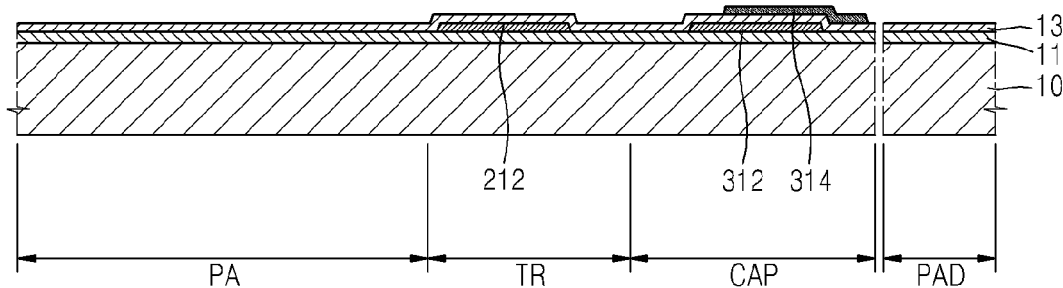

FIG. 5B is a cross-sectional view schematically illustrating a second mask process of the organic light-emitting display apparatus.

Referring to FIG. 5B, the third insulating layer 13 is formed on the resultant structure of the first mask process, and a transparent conductive oxide layer (not shown) is formed on the third insulating layer 13 and patterned to form the second electrode 314 of the capacitor on the third insulating layer 13.

Figure 5C:
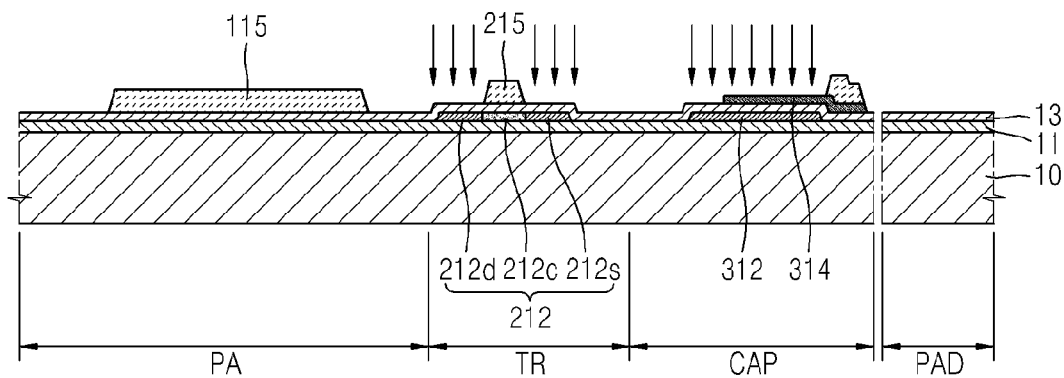

FIG. 5C is a cross-sectional view schematically illustrating a third mask process of the organic light-emitting display apparatus.

Referring to FIG. 5C, a first metal layer (not shown) is stacked on the resultant of the second mask process and is patterned. In some embodiments, the first metal layer may be formed of at least one selected from the group consisting of Al, Pt, Pd, Ag, Mg, Au, Ni, Nd, Ir, Cr, Li, Ca, Mo, Ti, W, and Cu, and may be formed as a single layer or multiple layers. By patterning the first metal layer, the gate electrode 215 and a gate metal layer 115 may be formed on the third insulating layer 13.

Ion impurities such as boron (B) or phosphorous (P) ions may be doped on the resultant structure at a doping concentration greater than $1 \times 10^{15}$ atoms/$cm^3$ by using the active layer 212 of the TFT and the first electrode 312 of the capacitor as a target.

By using the gate electrode 215 as a self-align mask, ion impurities are doped in the active layer 212 to form source and drain regions 212s and 212d doped with ion impurities and a channel region 212c between the source and drain regions 212s and 212d. Here, the first electrode 312 of the capacitor also becomes an electrode forming a MIM CAP doped with the ion impurities.

By simultaneously doping the active layer 212 and the first electrode 312 of the capacitor through a one-time doping process, manufacturing costs may be reduced as the doping process is simplified.

In some embodiments, the gate metal layer 115 may be formed on the pixel area PA and may minimize an influence of the ion impurities on the pixel area PA by covering it while the ion impurities are doped. In the present embodiment, the gate metal layer 115 is formed on the pixel area PA, but the gate metal layer 115 may not always be formed.

Figure 5D:
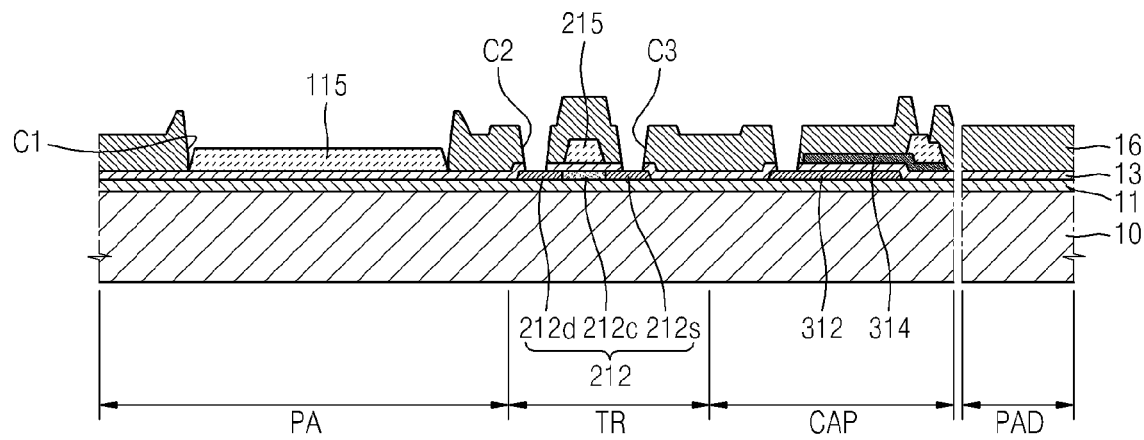

FIG. 5D is a cross-sectional view schematically illustrating a fourth mask process of the organic light-emitting display apparatus.

Referring to FIG. 5D, the fourth insulating layer 16 is formed on the resultant structure of the third mask process, and is patterned to form openings C1, C2 and C3. In some embodiments, the opening C1 is formed in a region that is separated from a side of the active layer 212, and the openings C2 and C3 expose the source and drain regions 212s and 212d of the active layer 212, respectively.

Figure 5E:
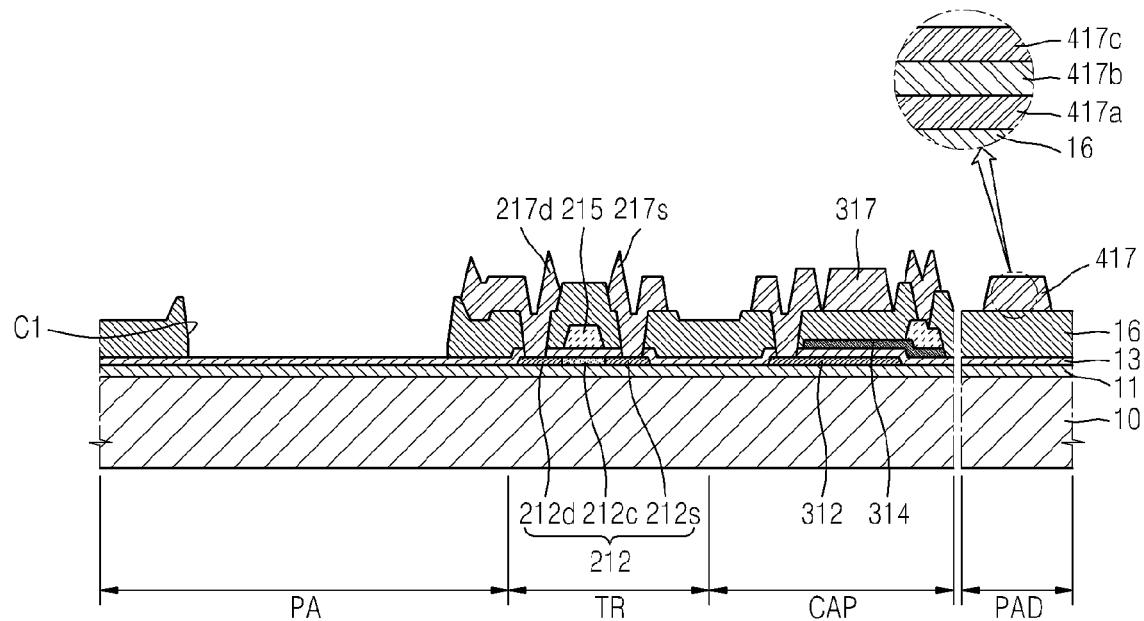

FIG. 5E is a cross-sectional view schematically illustrating a fifth mask process of the organic light-emitting display apparatus.

Referring to FIG. 5E, a second metal layer (not shown) is formed on a resultant structure of the fourth mask process, and is patterned to simultaneously form the source and drain electrodes 217s and 217d, the third electrode 317 of the capacitor, and the first pad layer 417. In some embodiments, the gate metal layer 115 (shown in FIG. 5D) formed on the pixel area PA may be removed while patterning the second metal layer.

In some embodiments, the second metal layer may have at least two metal layers formed of different metals having different electron mobilities. For example, the second metal layer may be formed of at least two materials selected from the group consisting of Al, Pt, Pd, Ag, Mg, Au, Ni, Nd, Ir, Cr, Li, Ca, Mo, Ti, W, Cu, and alloys thereof.

To exemplify a configuration of the second metal layer, the structure of the first pad layer 417 is shown in detail. For example, the second metal layer of the present embodiment may consist of a first layer 417a including Mo, a second layer 417b including Al, and a third layer 417c including Mo. The second layer 417b is a metal layer having a high electrical characteristic and low resistance, and the first layer 417a disposed at the bottom of the second layer 417b and including Mo reinforces adhesion with the fourth insulating layer 16. In some embodiments, the third layer 417c disposed at the top of the second layer 417b and including Mo may function as a barrier layer preventing a hillock oxidation, and diffusion.

Although not illustrated in the above drawings, data wiring may be formed as well after patterning the second metal layer in the fifth mask process.

Figure 5F:
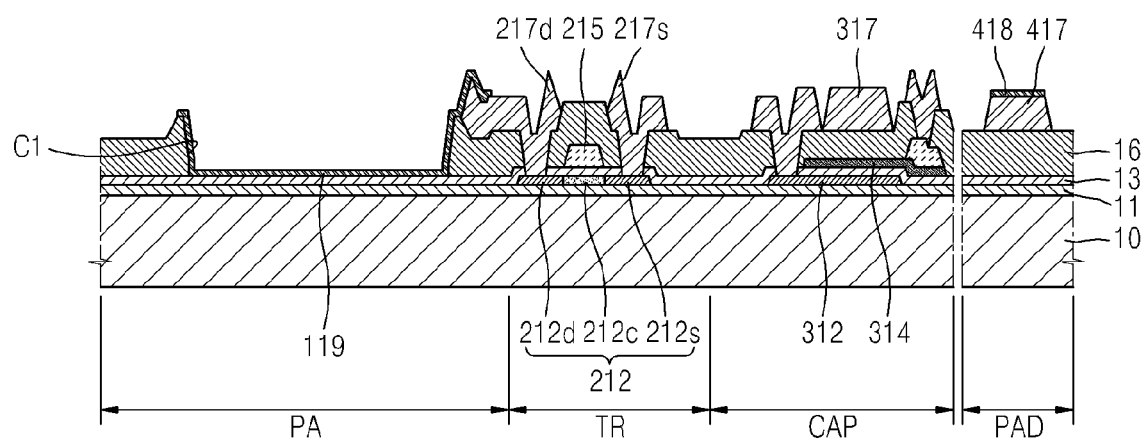

FIG. 5F is a cross-sectional view schematically illustrating a sixth mask process of the organic light-emitting display apparatus.

Referring to FIG. 5F, a transparent conductive oxide layer (not shown) is formed on the resultant structure of the fifth mask process, and is patterned to simultaneously form the transparent protection layer 119 and the second pad layer 418 of the pad electrode.

Figure 5G:
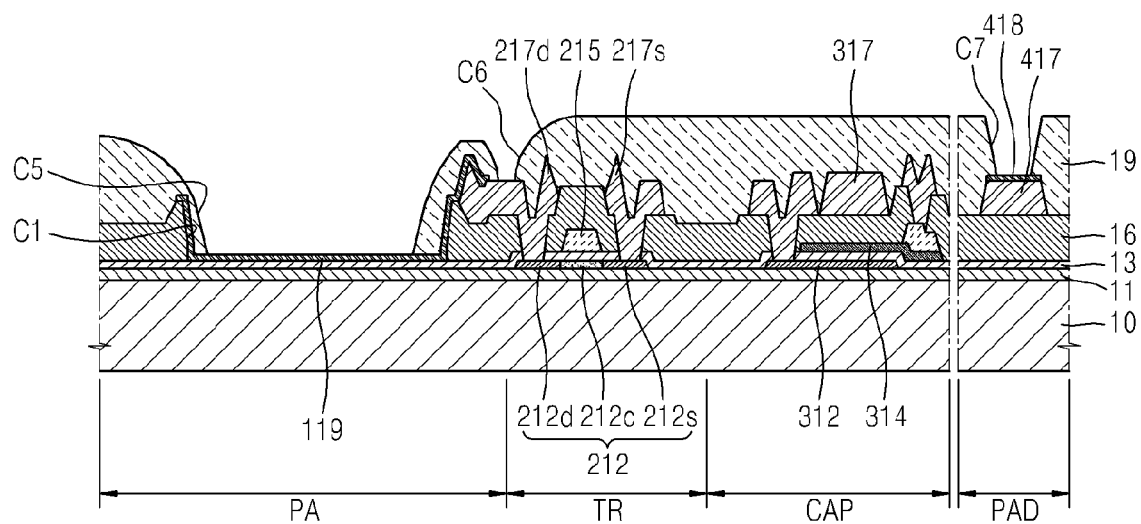

FIG. 5G is a cross-sectional view schematically illustrating a seventh mask process of the organic light-emitting display apparatus.

Referring to 5G, the first insulating layer 19, which is a planarization insulating layer, is formed on the resultant structure of the sixth mask process and is patterned to form the first opening C5 and contact holes C6 and C7. In some embodiments, the first opening C5 is formed in a pixel area PA in which the pixel electrode 120 (as described below referring to FIG. 5H) will be disposed. In some embodiments, the contact hole C6 exposes the top surface of the drain electrode 217d, and the contact hole C7 exposes the top surface of the first pad layer 417.

In some embodiments, the first insulating layer 19 is formed of organic materials, and covers the source and drain electrodes 217s and 217d. When the pixel electrode 120 including the silver is etched by the first insulating layer 19, different types of wiring having different potential may prevent the pixel electrode 120 from contacting the etchant in which the silver ions are dissolved.

In some embodiments, the first opening C5 of the first insulating layer 19 may overlap with and be smaller than the opening C1 formed on the fourth insulating layer 16.

Figure 5H:
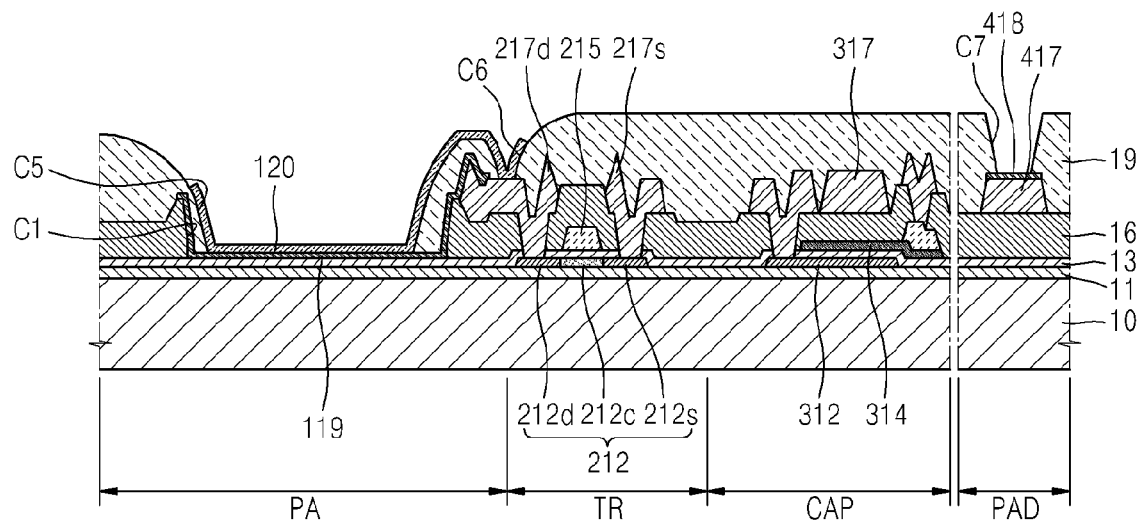

FIG. 5H is a cross-sectional view schematically illustrating an eighth mask process of the organic light-emitting display apparatus.

Referring to 5H, a transflective metal layer (not shown) is formed on a resultant structure of the seventh mask process and is patterned to form the pixel electrode 120.

In some embodiments, the pixel electrode 120 may be disposed in the first opening C5 of the first insulating layer 19, and may be electrically connected to the drain electrode 217d of the TFT through the contact hole C6.

In some embodiments, the pixel electrode 120 is formed of the transflective metal layer 120b of FIG. 1. In some embodiments, the pixel electrode 120 may further include the first and second transparent conductive oxide layers 120a and 120c which are respectively formed at the top and the bottom surfaces of the transflective metal layer 120b (referring FIG. 1).

In some embodiments, the transflective metal layer 120b of FIG. 1 may be formed of silver (Ag) or a silver (Ag) alloy. In some embodiments, the first and second transparent conductive oxide layers 120a and 120c may include at least one selected from the group consisting of ITO, IZO, ZnO, $In_2O_3$, IGO, and AZO. In some embodiments, the transflective metal layer 120b forms a micro-cavity structure with the opposite electrode 122 at is reflective electrode, and thus the luminescence efficiency of the organic light-emitting display apparatus may be improved.

When the metal having high reduction potential, for example, silver, receives electrons during the etching process for patterning the pixel electrode 120, the silver (Ag) ions that were in an ion state in the etchant may be educed as the silver (Ag). In the present embodiments, however, the source electrode 217s or the drain electrode 217d is already patterned before the eighth mask process for patterning the pixel electrode 120, and is covered by the first insulating layer 19 that is an organic layer, and thus the source electrode 217s or the drain electrode 217d is not exposed to the etchant including the silver (Ag) ions while etching the pixel electrode 120 including the silver (Ag) and thus, defects caused by the reduction of the silver (Ag) are prevented.

Figure 5I:
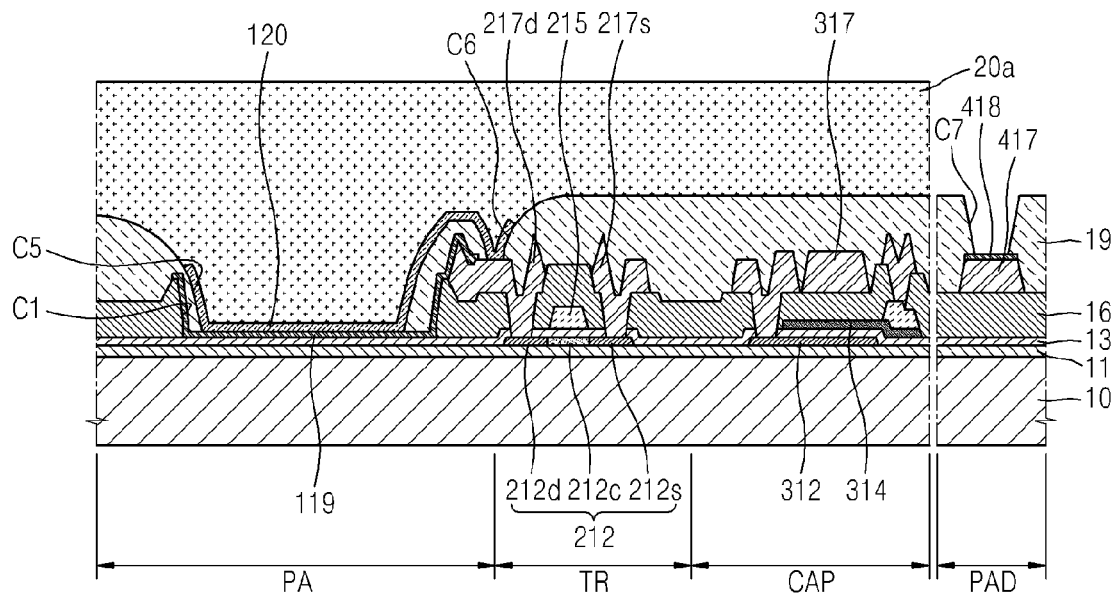
Figure 5J:
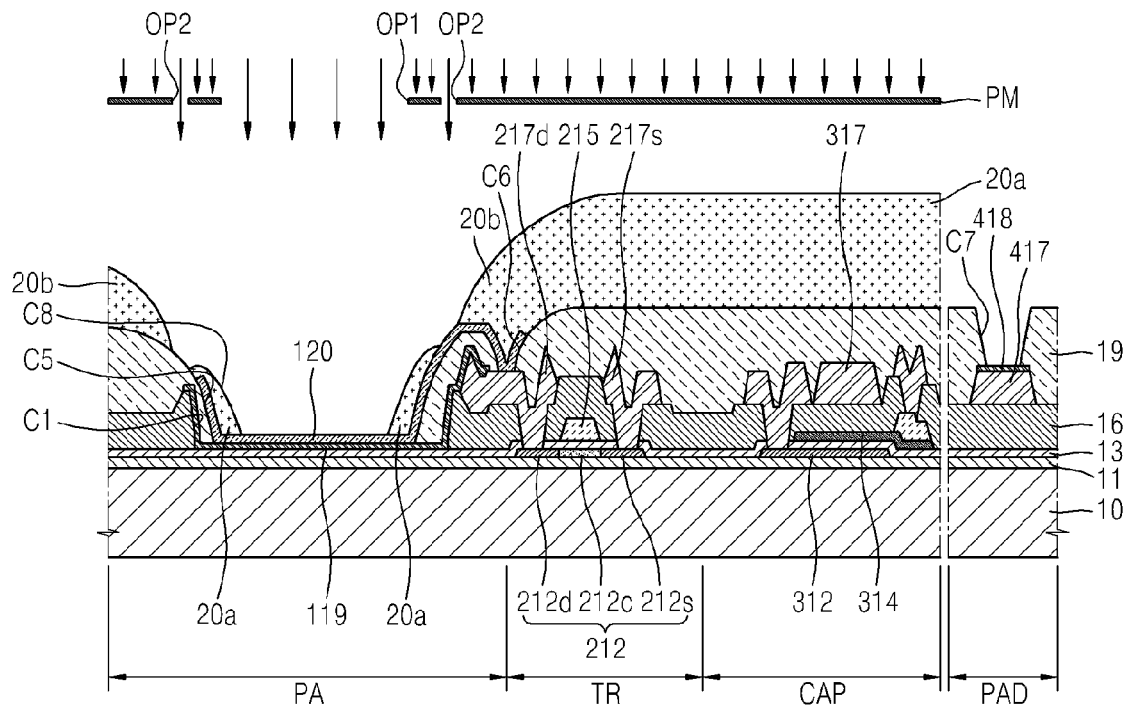
Figure 5K:
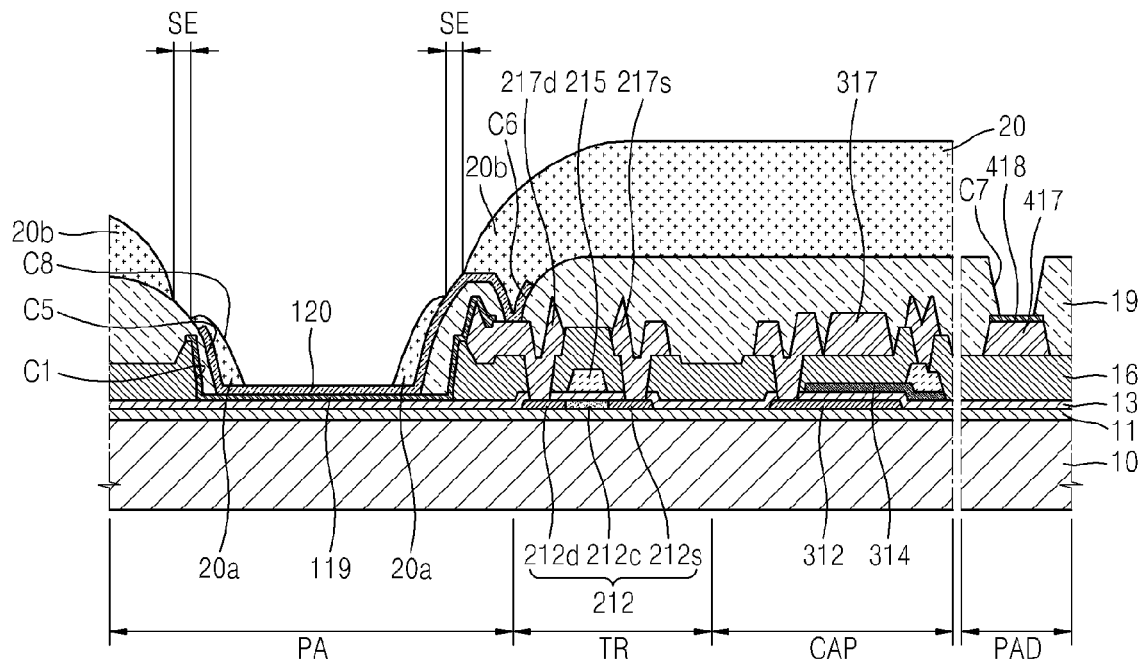
Figure 5L:
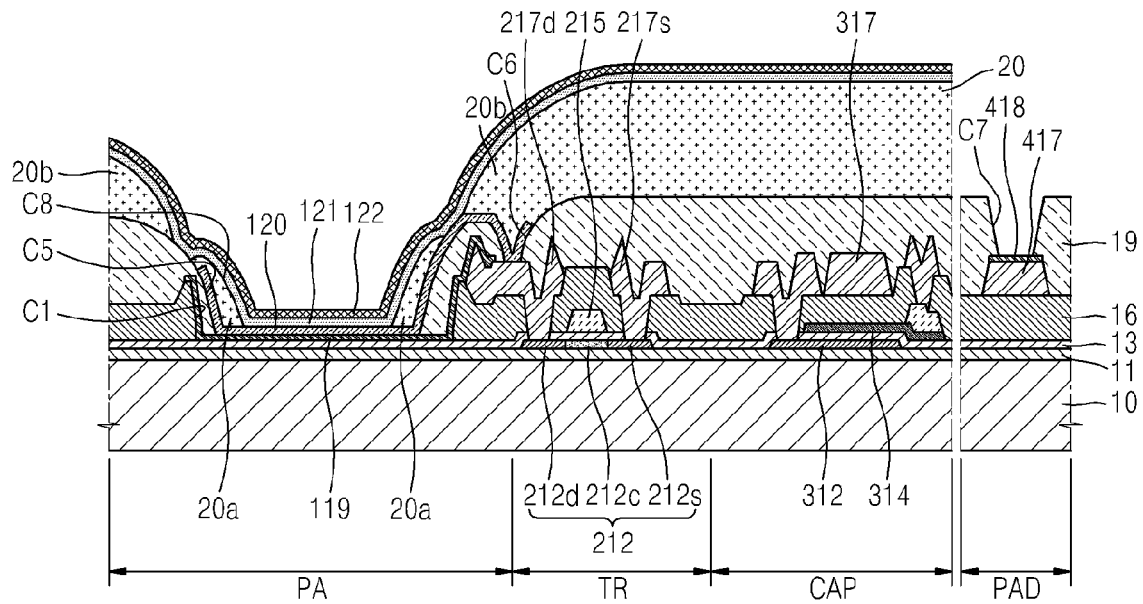

FIGS. 5I through 5K are cross-sectional views schematically illustrating a ninth mask process of the organic light-emitting display apparatus.

Referring to FIGS. 5I through 5K, the second insulating material 20a is formed on the resultant structure of the eighth mask process, and is exposed to the light by using a photo mask PM in which first and second holes OP1 and OP2 are formed. Then, through processes such as a developing process, a curing process, etc., the second insulating layer 20 is formed.

In some embodiments, the second insulating layer 20 may include the second opening C8 formed at a location corresponding to the first hole OP1 of the photo mask, and the separation part SE formed at a location corresponding to the second hole OP2 of the photo mask. In some embodiments, the second opening C8 may overlap with the opening C1 and the first opening C5 formed on the fourth insulating layer 16, and may be smaller than the first opening C1. In some embodiments, the first insulating layer 19 may be exposed through at least one portion of the separation part SE.

In some embodiments, the second insulating layer 20 works as a pixel definition layer, and may be formed of an organic insulating layer including, for example, general-purpose polymers such as PMMA or PS, polymer derivatives having a phenol group, an acryl-based polymer, an imide-based polymer, an aryl ether-based polymer, an amide-based polymer, a fluorine-based polymer, a p-xylene based polymer, a vinyl alcohol-based polymer, and compounds thereof.

In some embodiments, the second insulating layer 20 formed of the organic materials may provide a passage for the external source of pollution ps (refer to FIG. 4) to transfer into the intermediate layer 121. The external source of pollution ps transferring through the bulk of the second insulating layer 20 may cause the pixel shrinkage that deteriorates the organic light-emitting layer.

However, according to the present embodiments, the separation part SE is formed on the second insulating layer 20 so that the transfer path of the external source of pollution ps may be blocked and the pixel shrinkage caused by the external source of pollution ps may be restricted.

In some embodiments, the separation part SE may be formed as a ring type encircling the edge of the pixel areas PA. In some embodiments, the first and second insulating parts 20a and 20b are disposed to be apart from each other by the separation part SE. For example, the first insulating part 20a is disposed inside the separation part SE, and the second insulating part 20b is disposed outside the outer portion.

Since the first insulating part 20a includes the second opening C8 exposing the top of the pixel electrode 120, the first insulating part 20a may have a ring shape. In some embodiments, the first insulating part 20a may cover at least one end portion of the pixel electrode 120. For example, the first insulating layer 20a may cover other ends of the pixel electrode 120 other than the at least one end portion of the pixel electrode 120 for connection with the TFT.

Referring to 5L, the intermediate layer 121 including the organic light-emitting layer is formed on a resultant structure of the ninth mask process, and the opposite electrode 122 is formed. According to the organic light-emitting display apparatus and the manufacturing method thereof, the pixel electrode 120 is formed of the transflective metal layer 120b, and the opposite electrode 122 is formed of the transparent metal layer so that the luminescence efficiency of the organic light-emitting display apparatus may be improved due to the microcavity structure.

Figure 6:
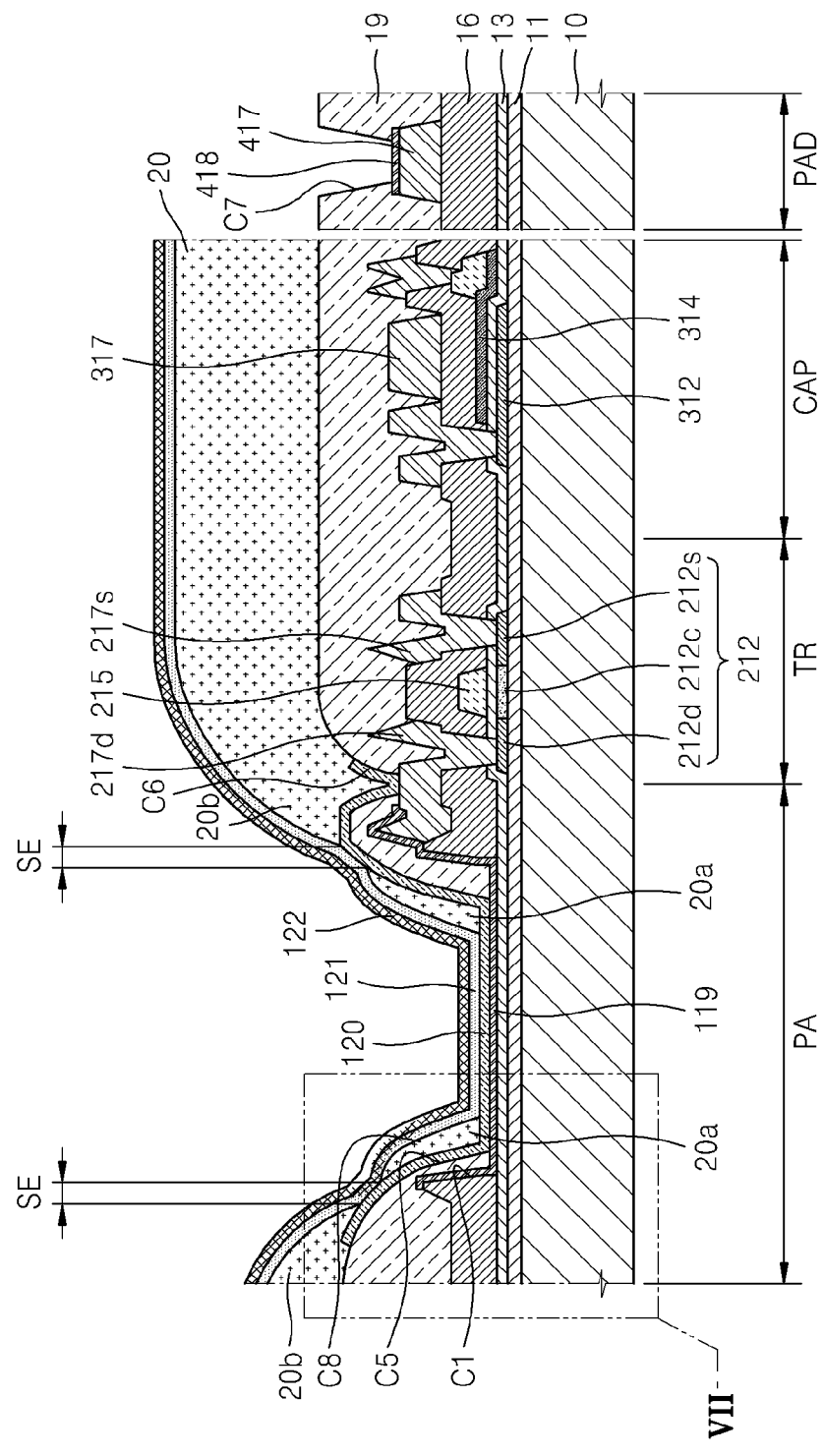
FIG. 6 is a cross-sectional view schematically illustrating an organic light-emitting display apparatus, according to another embodiment of the present invention.
Figure 7:
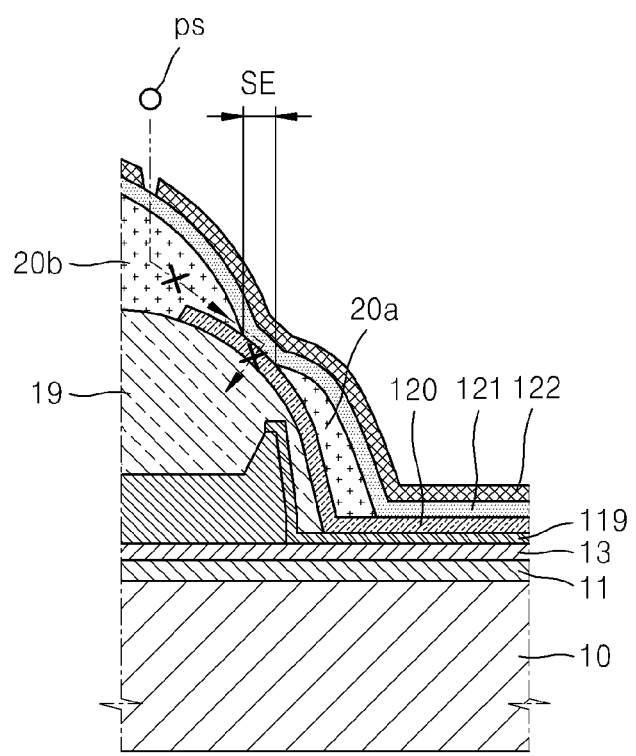
FIG. 7 is a cross-sectional view of an enlarged section VII of FIG. 6.

FIG. 6 is a cross-sectional view schematically illustrating the organic light-emitting display apparatus, according to another embodiment of the present disclosure, and FIG. 7 is a cross-sectional view of an enlarged section VII of FIG. 6.

The organic light-emitting display apparatus according to the embodiment shown with reference to FIGS. 6 and 7 includes a materially identical structure as the organic light-emitting display apparatus described with reference to FIGS. 1 to 3. Therefore, only the differences with the organic light-emitting display apparatus described with reference to FIGS. 1 to 3 will be mainly described hereinafter.

Referring to FIGS. 6 and 7, the second insulating layer 20 is formed to include the separation part SE so that the pixel shrinkage caused by the external source of pollution ps transferring through the bulk of the second insulating layer 20 is prevented as described above.

In addition, at least one end portion of the pixel electrode 120 according to the present embodiments may extend to pass the separation part SE and to be disposed under the second insulating layer 20. Therefore, the transfer of the external source of pollution ps not only through the bulk of the second insulating layer 20 but also through the first insulating layer 19 may be prevented.

For example, since at least one end portion of the pixel electrode 120 is extended to be disposed under the second insulating part 20b, the pixel electrode 120 may be interposed between the first insulating layer 19 and the second insulating part 20b of the second insulating layer 20. Accordingly, the external source of pollution ps, which is generated during a manufacturing process or penetrating through a fine crack or a hole formed on the opposite electrode 122, may not be transferred through the first insulating layer 19 after passing the second insulating layer 20.

According to the embodiment shown with reference to FIGS. 6 and 7, the OLED may be disposed at a location corresponding to the separation part SE, thus increasing a light-emitting area. For example, as parts of the pixel electrode 120, the intermediate layer 121, and the opposite electrode 122 are disposed on the location corresponding to the separation part SE, the location corresponding to the separation part SE as well as the location corresponding to the second opening C8 may emit light.

As described above, according to the one or more of the above embodiments, an organic light-emitting display apparatus having improved reliability may be provided.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present embodiments as defined by the following claims.

What is claimed is:

1. An organic light-emitting display apparatus comprising:
   a substrate;
   a thin film transistor (TFT) formed on the substrate and comprising an active layer, a gate electrode, a source electrode, and a drain electrode;
   a first insulating layer formed on the TFT, and comprising a first opening formed on a place corresponding to a pixel area;
   a pixel electrode formed in the first opening of the first insulating layer, and electrically coupled to one of the source electrode and the drain electrode;
   a second insulating layer formed on the first insulating layer comprising a first insulating part comprising a second opening formed on a place corresponding to the first opening of the first insulating layer, and a second insulating part separated from the first insulating part in order to interpose a separation part between the first insulating part and the second insulating part;
   an intermediate layer formed on the pixel electrode and comprising an organic light-emitting layer; and
   an opposite electrode formed on the intermediate layer.

2. The organic light-emitting display apparatus of claim 1, wherein the separation part has a ring shape, and is formed along an edge of the pixel area.

3. The organic light-emitting display apparatus of claim 2, wherein the first insulating part is disposed at an inside of the separation part, and the second insulating part is disposed at an outside of the separation part.

4. The organic light-emitting display apparatus of claim 1, wherein an end portion of the pixel electrode is disposed at an upper portion of the first opening formed in the first insulating layer.

5. The organic light-emitting display apparatus of claim 1, wherein the first insulating layer is exposed through at least a part of the separation part.

6. The organic light-emitting display apparatus of claim 1, wherein at least an end portion of the pixel electrode is disposed inside an outer end of the first insulating part nearest the substrate.

7. The organic light-emitting display apparatus of claim 1, wherein at least an end portion of the pixel electrode extends towards the second insulating part so as to be interposed between the first insulating layer and the second insulating part of the second insulating layer.

8. The organic light-emitting display apparatus of claim 1, wherein respective portions of the pixel electrode, the intermediate layer, and the opposite electrode are disposed at the separation part.

9. The organic light-emitting display apparatus of claim 1, wherein the second insulating layer comprises an organic material.

10. The organic light-emitting display apparatus of claim 1, wherein the first insulating layer comprises an organic material.

11. The organic light-emitting display apparatus of claim 1, wherein the pixel electrode comprises a transflective metal layer.

12. The organic light-emitting display apparatus of claim 11, wherein the transflective metal layer is formed of silver (Ag) or silver alloy.

13. The organic light-emitting display apparatus of claim 11, wherein the pixel electrode further comprises a transparent conductive oxide layer disposed on at least one side of the transflective metal layer.

14. The organic light-emitting display apparatus of claim 1, wherein the opposite electrode comprises a reflective metal layer.

15. The organic light-emitting display apparatus of claim 1, further comprising:
 a transparent protection layer formed between the first insulating layer and the pixel electrode.

16. The organic light-emitting display apparatus of claim 15, wherein the transparent protection layer comprises a transparent conductive oxide material.

17. The organic light-emitting display apparatus of claim 16, wherein the pixel electrode further comprises a pixel electrode contact unit electrically coupled with the TFT through the transparent protection layer.

18. The organic light-emitting display apparatus of claim 1, further comprising:
 a third insulating layer disposed between the active layer and the gate electrode; and
 a fourth insulating layer disposed between the gate electrode, and the source electrode and the drain electrode.

19. The organic light-emitting display apparatus of claim 18, wherein an opening formed in the fourth insulating layer, the first opening formed in the first insulating layer, and the second opening formed in the second insulating layer overlap one another.

20. The organic light-emitting display apparatus of claim 18, wherein the opening formed in the fourth insulating layer is larger than the first opening, and the first opening is larger than the second opening.

\* \* \* \* \*